United States Patent
Thiery et al.

(10) Patent No.: US 7,288,856 B2
(45) Date of Patent: Oct. 30, 2007

(54) REVERSE BATTERY PROTECTION CIRCUIT FOR POWER SWITCH

(75) Inventors: Vincent Thiery, La Roque D'Antheron (FR); Bruno Charles Nadd, Lourmarin (FR)

(73) Assignee: International Rectifier Corporation, El Segundo, CA (US)

( * ) Notice: Subject to any disclaimer, the term of this patent is extended or adjusted under 35 U.S.C. 154(b) by 432 days.

(21) Appl. No.: 10/841,313

(22) Filed: May 7, 2004

(65) Prior Publication Data

US 2004/0228053 A1 Nov. 18, 2004

Related U.S. Application Data

(60) Provisional application No. 60/470,476, filed on May 14, 2003, provisional application No. 60/477,420, filed on Jun. 10, 2003.

(51) Int. Cl.
  *H02B 1/24* (2006.01)
(52) U.S. Cl. ....................................... 307/127
(58) Field of Classification Search ................. 307/127
See application file for complete search history.

(56) References Cited

U.S. PATENT DOCUMENTS 4,992,683 A 2/1991 Robin, Jr.
6,034,448 A 3/2000 Xu et al.

FOREIGN PATENT DOCUMENTS

| DE | 37 41 394 A1 | 6/1989 |
|----|--------------|--------|
| DE | 195 34 159 A1 | 3/1997 |
| DE | 197 42 169 A1 | 4/1999 |
| JP | 6-129337 | 5/1994 |

OTHER PUBLICATIONS

R.G. Keen, Advanced Power Switching and Polarity Protection for Effects, 1999, pp. 1-4.*
Official Notice of Rejection mailed Jul. 7, 2006 from Japanese Patent Office with English language translation.
Official Letter dated Jul. 6, 2005 from German Patent Office with partial English language translation.

* cited by examiner

*Primary Examiner*—Robert L. Deberadinis
(74) *Attorney, Agent, or Firm*—Ostrolenk, Faber, Gerb & Soffen, LLP

(57) ABSTRACT

A circuit for protecting a power switch in the event of a reverse battery connection, wherein the power switch comprises a MOSFET having a body diode and the MOSFET is connected in series with a load, the circuit comprising terminals connected to the circuit and normally connectable to respective positive and negative power potentials of the battery, and the circuit comprising a switching circuit coupled to the terminals such that the switching circuit turns on the power switch in the event that the terminals are connected with a reverse battery connection.

10 Claims, 3 Drawing Sheets

US 7,288,856 B2

REVERSE BATTERY PROTECTION CIRCUIT FOR POWER SWITCH

CROSS REFERENCE TO RELATED APPLICATION

The present application claims the priority and benefit of U.S. Provisional Application Ser. No. 60/477,420, filed Jun. 10, 2003, (IR-1852 PROV II (2-3558)) entitled IMPROVED METHOD TO REMOTELY SENSE THE TEMPERATURE OF A POWER SEMICONDUCTOR, IN PARTICULAR OF THE POWER MOS DEVICE and U.S. Provisional Application Ser. No. 60/470,476, filed May 14, 2003 (IR-1851 (2-2286)) entitled CURRENT SENSING DRIVER OPERABLE IN LINEAR AND SATURATED REGIONS, the entire disclosures of which are hereby incorporated by reference herein.

BACKGROUND OF THE INVENTION

The present invention relates to protection circuits for power switches, and in particular, to a reverse battery protection circuit for a power switch.

Power switches are employed to switch electrical loads, for example, such loads as electrical motors. With reference to FIG. 1, a simplified prior art circuit showing a driver 30 driving a power switch 10 comprising a MOSFET is shown. The MOSFET switches the load 20, which might comprise an electrical motor. In an automotive application, the load and power switch are provided in series across the battery connections. The MOSFET power switch 10 includes a body diode 10A, which, in normal operation when the battery is connected as shown in FIG. 1, is back biased. However, as shown in FIG. 2, if the battery connections are inadvertently reversed, body diode 10A will conduct, and because of its relatively high forward voltage drop, dissipate a substantial amount of power which can lead to destruction of the switching device 10. For example, as shown in FIG. 1, when the battery is connected properly, the power dissipation in the semicondutor switch 10 is on the order of approximately 1 watt, assuming a current through the load of about 10 amps and an RDSon of the semiconductor switch of about 10 milli ohms. If the battery is improperly connected in a reverse battery connection, which may occur accidently upon improper installation of the battery or during a reverse jumping of a dead battery from a good battery, the power dissipated in the body diode of the switch, which will be forward biased as shown in FIG. 2, is approximately 6 watts considering that the forward voltage drop of the diode is 0.6 volts and the current remains at 10 amps. This six-fold power dissipation may destroy the switching device.

SUMMARY OF THE INVENTION

It is accordingly an object of the present invention to provide a reverse battery protection circuit which will prevent damage to the semiconductor switching device if the battery is reverse connected.

The objects of the present invention are achieved by a circuit for protecting a power switch in the event of a reverse battery connection, wherein the power switch comprises a MOSFET having a body diode and the MOSFET is connected in series with a load, the circuit comprising terminals connected to the circuit and normally connectable to respective positive and negative power potentials of the battery, and the circuit comprising a switching circuit coupled to the terminals such that the switching circuit turns on the power switch in the event that the terminals are connected with a reverse battery connection.

The objects of the invention are also achieved by a method for protecting a power switch in the event of a reverse battery connection, wherein the power switch comprises a MOSFET having a body diode and the MOSFET is connected in series with a load, the method comprising providing terminals on a protective circuit normally connectable to respective positive and negative battery potentials of the battery; and providing a switching circuit coupled to the terminals such that the switching circuit turns on the power switch in the event that the terminals are connected with a reverse battery connection, thereby preventing the body diode from conducting.

Other features and advantages of the present invention will become apparent from the following description of the invention which refers to the accompanying drawings.

BRIEF DESCRIPTION OF THE DRAWING(S)

The invention will now be described in greater detail in the following detailed description with reference to the drawings in which.

DETAILED DESCRIPTION OF THE INVENTION

Figure 1:
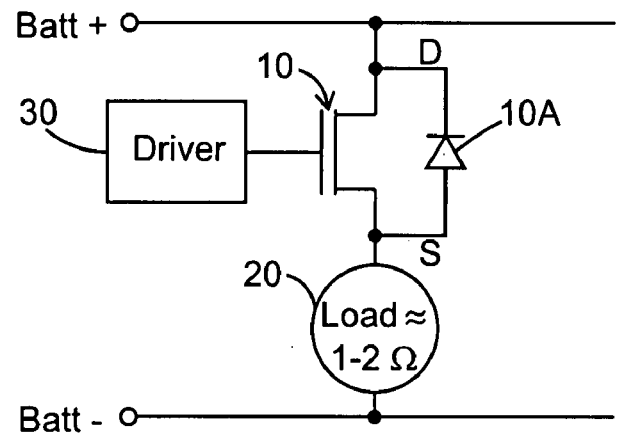
FIG. 1 shows a MOSFET power switching device according to the prior art connected to a load.
Figure 2:
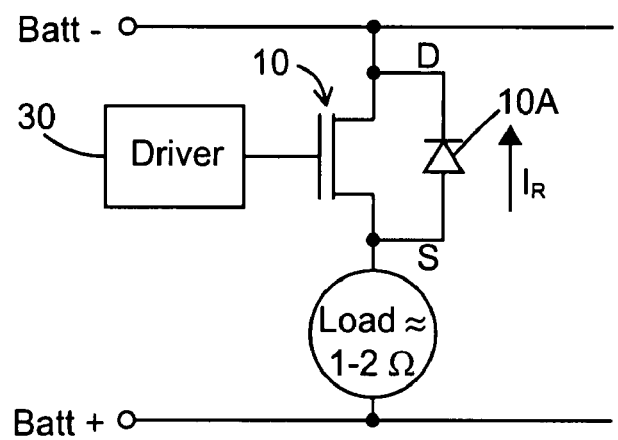
FIG. 2 shows the power switching device of FIG. 1 connected to a load under the influence of a reverse battery connection.
Figure 3:
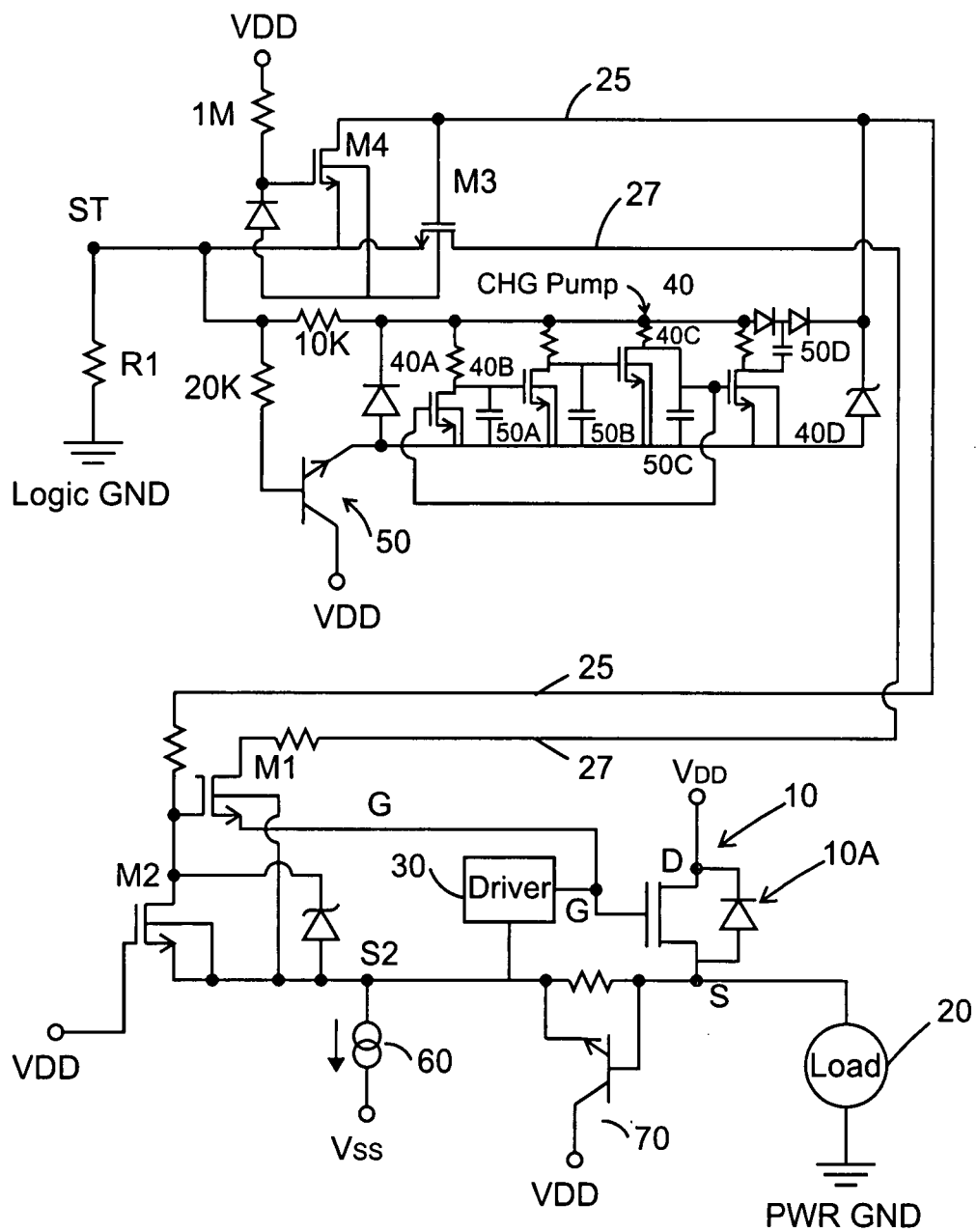
FIG. 3 shows a reverse battery protection circuit according to the invention.

With reference now to the drawings, FIG. 3 shows a reverse battery protection circuit according to the present invention. The power switch is again shown by reference numeral 10. The body diode is indicated at 10A. The load 20 is connected in series with the power switch.

The present invention provides a circuit to turn on the power switch 10 in the event of a reverse battery connection. This will prevent the body diode 10A from conducting and dissipating power. The load will be energized in the reverse current direction but this will not generally cause any damage because the body diode is not conducting, and the power dissipated in the switch 10 is the same power as would be dissipated in the switch 10 when the switch is on under proper battery connections.

The basic reverse battery protection circuit is based around MOSFETS M1 and M2.

With reference to FIG. 3, terminal ST is connected to a logic ground, typically through a low resistance R1. The load 20 is connected to a power ground. VDD represents the voltage from the battery, typically 12-14 volts. Under a proper battery connection, VDD is at 12-14 volts and ST is at ground level. Under these circumstances, the gate of MOSFET M3 connected to line 25 will be low and MOSFET M3 will be off. MOSFET M4 is on holding the gate of M3 low. This will cause line 27 to be floating and the gate (line 25) of MOSFET M1 to be low and thus MOSFET M1 will be off. Also, a MOSFET M2, whose gate is connected to VDD, is turned on, ensuring the gate of MOSFET M1 is low, and thus off. Accordingly, the driver 30 driving the power switch 10 will operate the power switch 10 in its normal mode to drive the load 20.

In addition, a charge pump 40 comprising a plurality of MOSFETS 40A, 40B, 40C and 40D will be off because transistor 50 is maintained off.

Under a reverse battery connection, VDD will be at ground and ST will be at a positive voltage level, typically from 5-14 volts. As a result, line 25 will be high turning on MOSFET M3. MOSFET M4 will be off. Accordingly, the gate of MOSFET M1 will be high and line 27 will also be high because M3 is on. Accordingly, M1 is turned on causing the high signal on line 27 to be provided to the gate of power MOSFET switching device 10, turning it on, thereby preventing the reverse battery connection from conducting through the body diode 10A which cannot conduct when the power switch 10 is on. The reverse battery connection results in conduction through the load and the power MOSFET 10, but the body diode 10A is not conductive.

In addition, a charge pump 40 may be provided comprising the transistors 40A, 40B, 40C and 40D and capacitors 50A, 50B, 50C and 50D. The charge pump is provided to avoid a voltage drop due to the bulk effect which may be too great a voltage drop at a low reverse battery connection to turn on the MOSFETs. The charge pump only operates during a reverse battery connection. When the battery is reverse connected, the transistor 50 allows charging of the charge pump between ST and VDD. During normal battery connection, the gate of M1 is shorted by transistor M2 to the source connection S2 to prevent M1 from turning on.

In addition, a further transistor, bipolar transistor 70 and current source 60, may be provided. There are provided to prevent the gate of the driver output from shorting to the source S2.

Figure 5:
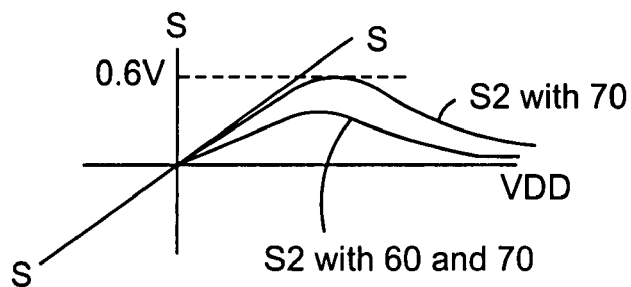
FIG. 5 shows a graph to explain the circuit of FIGS. 3 and 4.

If source S2, which is connected to the substrate of the driver 30, is greater than about 0.6 V, then current will flow in the body diode of the output transistor (not shown) of the driver 30. In this case, all n+ nodes of the driver transistor will be shorted to VDD by a parasitic bipolar transistor. In particular, this will cause the gate to be shorted to the source of the driver output. Current source 60 and bipolar transistor 70 are provided to avoid the condition that S2-VDD is greater than 0.5V. Thus, the gate of the driver is not shorted to the source. FIG. 5 shows this graphically. The voltage S2 is prevented from rising to 0.6V by transistor 70 and current source 60.

Figure 4:
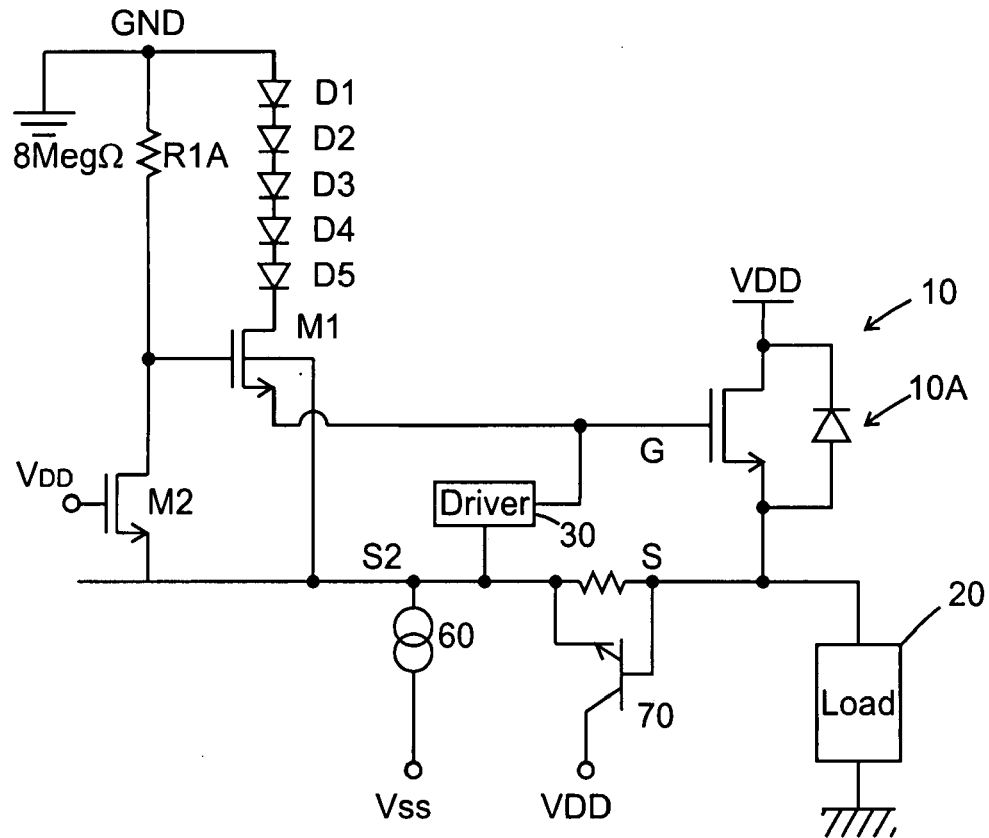
FIG. 4 shows a simplified reverse battery protection circuit according to the invention.

FIG. 4 shows a simplified reverse battery protection circuit. It is basically the same as the circuit of FIG. 3 but eliminates the charge pump 40 as well as transistors M3, M4 and 50. Transistors M3 and M4 have been reduced to the resistor R1A and diodes D1 to D5. Transistors M1 and M2 operate in the same was described with respect to FIG. 3. Thus, when the battery is properly polarized, transistor M2 is turned on and transistor M1 is off, thus allowing driver 30 to operate transistor 10 in a normal fashion. When the battery is reverse connected, transistor M2 is off and M1 is on and the gate of the transistor 10 is high, turning it on and preventing the body diode 10A from conducting. Current source 60 and transistor 70 are provided for the same reasons discussed with respect to FIGS. 3 and 4. In the event of a reverse battery connection, transistor M2 is turned off and transistor M1 is turned on thus allowing current to flow through diodes D1-D5 through transistor M1 turning on transistor 10, preventing reverse current flow through the body diode.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A circuit for protecting a power switch in the event of a reverse battery connection, wherein the power switch comprises a MOSFET having a body diode and the MOSFET is connected in series with a load, the circuit comprising:

terminals for being normally connected to respective positive and negative power potentials of the battery; and a switching circuit coupled to the terminals which turns on the power switch in the event that the terminals are connected with a reverse battery connection;

wherein the switching circuit comprises:

a first switch having a first main terminal coupled, when the battery is properly connected, to the negative battery connection and a second main terminal coupled to the gate of the power switch;

the first switch having a control terminal coupled, when the battery is properly connected, to the negative battery connection, whereby said first switch is normally non-conductive in the event of a proper battery connection and conductive in the event of a reverse battery connection;

a second switch having a control terminal coupled, when the battery is properly connected, to the positive battery connection and having a main terminal coupled to the first switch control terminal to maintain the first switch in an off state when the battery is properly connected;

whereby in the event of a reverse battery connection, said first switch turns on thereby providing a positive battery potential to the gate of said power switch to turn the power switch on.

2. The circuit of claim 1, further comprising third and fourth switches coupled to the first switch to maintain the first switch off when the battery is properly connected and to turn the first switch on when the battery is reverse connected.

3. The circuit of claim 2, wherein said first, second, third and fourth switches are MOSFETS.

4. The circuit of claim 1, further comprising a charge pump controlled on only in the event of a reverse battery connection to provide an adequate voltage level to the control terminals of said first switch.

5. The circuit of claim 4, further comprising a fifth switch that is turned on in the event of a reverse battery connection to enable said charge pump to charge and turned off in the event of a proper battery connection.

6. The circuit of claim 5, wherein said fifth switch comprises a bipolar transistor.

7. A circuit for protecting a power switch in the event of a reverse battery connection, wherein the power switch comprises a MOSFET having a body diode and the MOSFET is connected in series with a load, the circuit comprising:

terminals for being normally connected to respective positive and negative power potentials of the battery such that said body diode is normally reverse-biased by said positive and negative battery potentials and forward-biased by a reverse battery connection; and a switching circuit coupled to the terminals which supplies a control voltage to a control terminal of said power switch so as to turn on the power switch in the event that the terminals are connected with a reverse battery connection;

further comprising a circuit to prevent a short circuit in a driver transistor for said power switch by maintaining a substrate potential of said driver transistor below the threshold of the driver transistor.

8. The circuit of claim 7, wherein said short circuit preventing circuit comprises a transistor switch coupled to the source of said power switch for shunting current away from the source of said power switch.

9. The circuit of claim 8, wherein said short circuit preventing circuit further comprises a current source to shunt current away from the source of said power switch.

10. The circuit of claim 8, wherein said transistor switch comprises a bipolar transistor.

* * * * *